United States Patent
Liu et al.

(10) Patent No.: US 9,748,256 B2
(45) Date of Patent: Aug. 29, 2017

(54) SEMICONDUCTOR DEVICE AND METHOD OF FORMING THE SAME

(71) Applicant: United Microelectronics Corp., Hsinchu (TW)

(72) Inventors: Wei-Chang Liu, Singapore (SG); Zhen Chen, Singapore (SG); Shen-De Wang, Hsinchu County (TW); Wang Xiang, Singapore (SG); Yi-Shan Chiu, Taoyuan (TW); Wei Ta, Singapore (SG)

(73) Assignee: United Microelectronics Corp., Hsinchu (TW)

( * ) Notice: Subject to any disclaimer, the term of this patent is extended or adjusted under 35 U.S.C. 154(b) by 0 days.

(21) Appl. No.: 14/924,525

(22) Filed: Oct. 27, 2015

(65) Prior Publication Data

US 2017/0077110 A1 Mar. 16, 2017

(30) Foreign Application Priority Data

Sep. 16, 2015 (TW) .............................. 104130582 A

(51) Int. Cl.
*H01L 29/788* (2006.01)
*H01L 27/11524* (2017.01)
*H01L 21/28* (2006.01)

(52) U.S. Cl.
CPC .. *H01L 27/11524* (2013.01); *H01L 21/28273* (2013.01)

(58) Field of Classification Search
CPC ......... H01L 27/11521; H01L 29/66825; H01L 27/11524; H01L 21/28273

USPC .......................... 257/318, 316; 438/275, 258
See application file for complete search history.

(56) References Cited

U.S. PATENT DOCUMENTS

| 5,445,983 A * | 8/1995 | Hong ................ H01L 27/11517 257/E21.68 |
| 5,914,519 A | 6/1999 | Chou et al. |
| 6,190,981 B1 | 2/2001 | Lin et al. |
| 2009/0085092 A1* | 4/2009 | Nagai ................ H01L 21/28273 257/316 |
| 2012/0276711 A1 | 11/2012 | Yoon et al. |
| 2013/0026552 A1 | 1/2013 | Toh et al. |
| 2014/0264531 A1* | 9/2014 | Goyo ................ H01L 29/66825 257/316 |
| 2015/0129947 A1* | 5/2015 | Nagashima ....... H01L 27/11524 257/314 |
| 2016/0071857 A1* | 3/2016 | Kuge ................ H01L 21/31105 438/275 |

OTHER PUBLICATIONS

Wei-Chang Liu et al., "A Method of Fabricating a Memory Structure", Unpublished U.S. Appl. No. 14/859,358, filed Sep. 21, 2015.

* cited by examiner

*Primary Examiner* — Mohammed Shamsuzzaman
(74) *Attorney, Agent, or Firm* — J. C. Patents

(57) ABSTRACT

Provided is a semiconductor device including a memory gate structure and a select gate structure. The memory gate structure is closely adjacent to the select gate structure. Besides, an air gap encapsulated by an insulating layer is disposed between the memory gate structure and the select gate structure.

4 Claims, 7 Drawing Sheets

SEMICONDUCTOR DEVICE AND METHOD OF FORMING THE SAME

CROSS-REFERENCE TO RELATED APPLICATION

This application claims the priority benefit of Taiwan application serial no. 104130582, filed on Sep. 16, 2015. The entirety of the above-mentioned patent application is hereby incorporated by reference herein and made a part of this specification.

BACKGROUND OF THE INVENTION

Field of Invention

The present invention is related to an integrated circuit and a method of forming the same, and more generally to a semiconductor device and a method of forming the same.

Description of Related Art

As technology advances, memory devices are minimized to meet the trend of lighter, thinner, shorter and smaller products. As the size of a memory device is scaled down, the distance between adjacent gates becomes shorter and the spacer width becomes smaller, resulting in a high inter-gate capacitive coupling and even a leakage current. Therefore, the performance of the device is degraded.

Besides, with the development of a multi-functional chip, integrating elements with different functions, e.g., a memory and a metal-oxide-semiconductor (MOS) transistor, into the same chip has become the mainstream in the market. However, the process for fabricating a memory is commonly separated from the process for fabricating a MOS transistor. Hence, multiple photo-masks and complicated process steps are required, so as to increase the process cost and weaken the competitiveness. Therefore, how to effectively integrate a memory and a MOS transistor has been drawn high attention in the industry.

SUMMARY OF THE INVENTION

Accordingly, the present invention provides a semiconductor device and a method of forming the same, in which the inter-gate capacitive coupling of a memory device can be reduced, and a memory and a MOS transistor can be effectively integrated together.

The present invention provides a semiconductor device including a memory gate structure and a select gate structure. The memory gate structure is closely adjacent to the select gate structure. Besides, an air gap encapsulated by an insulating layer is disposed between the memory gate structure and the select gate structure.

According to an embodiment of the present invention, the insulating layer includes silicon oxide.

According to an embodiment of the present invention, the semiconductor further includes a mask layer disposed between the air gap and the insulating layer, wherein the mask layer and the insulating layer have different etching rates.

According to an embodiment of the present invention, the select gate structure formed in a spacer shape is disposed on a sidewall of the memory gate structure.

According to an embodiment of the present invention, the semiconductor device further includes a doped region disposed in a substrate below the air gap.

According to an embodiment of the present invention, the memory gate structure includes a charge storage layer and a gate sequentially disposed on a substrate.

According to an embodiment of the present invention, the memory gate structure includes a tunnel insulating layer, a floating gate, an inter-gate dielectric layer and a control gate sequentially disposed on a substrate.

The present invention further provides a semiconductor device including a memory gate structure and a select gate structure. The memory gate structure is disposed on a substrate. The select gate structure is disposed on the substrate and closely adjacent to the memory gate structure, wherein an air gap is present between the memory gate structure and the select gate structure. Besides, a mask layer is located between the air gap and the substrate, and the mask layer includes a carbon-containing material, a nitrogen-containing material or a combination thereof.

According to an embodiment of the present invention, the mask layer includes SiN, SiCN, SiON, SiOCH, SiC, SiOC, SiOCN or a combination thereof.

According to an embodiment of the present invention, the semiconductor device further includes a silicon oxide layer disposed between the mask layer and the substrate.

According to an embodiment of the present invention, the select gate structure formed in a spacer shape is disposed on a sidewall of the memory gate structure.

According to an embodiment of the present invention, the semiconductor further includes a doped region disposed in the substrate below the air gap.

According to an embodiment of the present invention, the memory gate structure includes a charge storage layer and a gate sequentially disposed on the substrate.

According to an embodiment of the present invention, the memory gate structure includes a tunnel insulating layer, a floating gate, an inter-gate dielectric layer and a control gate sequentially disposed on the substrate.

The present invention also provides a method of forming a semiconductor device. At least one memory gate structure is formed on a substrate. A spacer is formed on a sidewall of the memory gate structure. An insulating layer is formed on the spacer and on the substrate. A select gate structure is formed on the substrate at one side of the memory gate structure. A portion of the spacer is removed, so as to form a gap between the select gate structure and the memory gate structure. An insulating layer is formed to seal the gap and therefore form an air gap.

According to an embodiment of the present invention, the spacer includes, from the sidewall of the memory gate structure, an insulating layer and a mask layer, and the mask layer includes a carbon-containing material, a nitrogen-containing material or a combination thereof.

According to an embodiment of the present invention, the step of removing the portion of the spacer includes completely removing the mask layer.

According to an embodiment of the present invention, the step of removing the portion of the spacer includes removing a portion of the mask layer.

According to an embodiment of the present invention, after the step of forming the gap and before the step of sealing the gap, the method further includes forming a doped region in the substrate below the gap.

According to an embodiment of the present invention, the select gate structure is formed in a spacer shape on the sidewall of the memory gate structure.

In view of the above, in the memory device of the invention, an air gap completely encapsulated by at least one insulating layer is present between the memory gate structure and the select gate structure. The inter-gate capacitance can be effectively reduced due to the low dielectric constant (low-k) property of air in the air gap, and thus, the RC delay can be reduced, and the cell speed can be increased. Besides, in the present invention, a memory device and a MOS transistor device can be easily integrated together with the existing process, so the process cost is significantly reduced and the competiveness is greatly improved.

In order to make the aforementioned and other objects, features and advantages of the present invention comprehensible, a preferred embodiment accompanied with figures is described in detail below.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF EMBODIMENTS

Figure 1A:
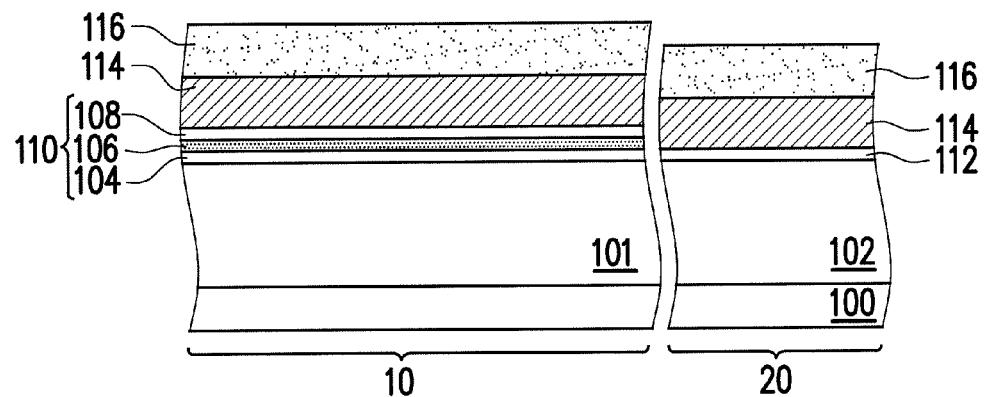
FIG. 1A to FIG. 1H are schematic cross-sectional views of a method of forming a semiconductor device according to an embodiment of the present invention.

Reference will now be made in detail to the present preferred embodiments of the invention, examples of which are illustrated in the accompanying drawings. Wherever possible, the same reference numbers are used in the drawings and the description to refer to the same or like elements.

FIG. 1A to FIG. 1H are schematic cross-sectional views of a method of forming a semiconductor device according to an embodiment of the present invention.

Referring to FIG. 1A, a substrate 100 is provided. The substrate 100 can be a semiconductor substrate, such as a silicon-containing substrate. The substrate 100 has a first area 10 and a second area 20. In an embodiment, a shallow trench isolation structure (not shown) can be disposed between the first area 10 and the second area 20. In an embodiment, the substrate 100 has a first well 101 formed in the first area 10 and a second well 102 formed in the second area 20. In an embodiment, the first area 10 can be a cell area, and the second area 20 can be a periphery area. In another embodiment, the first area 10 can be a memory device area, and the second area 20 can be a MOS device area or a low-voltage device area, but the present invention is not limited thereto.

In an embodiment, a composite dielectric layer 110 is formed on the substrate 100 in the first area 10 and an insulating layer 112 is formed on the substrate 100 in the second area 20. In an embodiment, the composite dielectric layer 110 can be an oxide-nitride-oxide (ONO) composite layer including a silicon oxide layer 104, a silicon nitride layer 106 and a silicon oxide layer 108. In an embodiment, the composite dielectric layer 110 is formed prior to the formation of the insulating layer 112. For example, a composite dielectric material layer is formed on the substrate 100 in the first and second areas 10 and 20 with at least one thermal oxidation process and/or at least one deposition process. Thereafter, the composite dielectric material layer in the second area 20 is removed by photolithography and etching processes, so as to form the composite dielectric layer 110 in the first area 10. Afterwards, an insulating layer 112 is formed in the second area 20 with a thermal oxidation process. In another embodiment, the composite dielectric layer 110 can be formed after the formation of the insulating layer 112.

Afterwards, a conductive layer 114 and a mask layer 116 are sequentially formed on the substrate 100 in the first and second areas 10 and 20. In an embodiment, the conductive layer 114 includes polysilicon, amorphous silicon or a combination thereof, the mask layer 116 includes silicon oxide, silicon nitride or a combination thereof, and the forming methods thereof include respectively performing suitable deposition processes such as chemical vapour deposition (CVD).

Figure 1B:
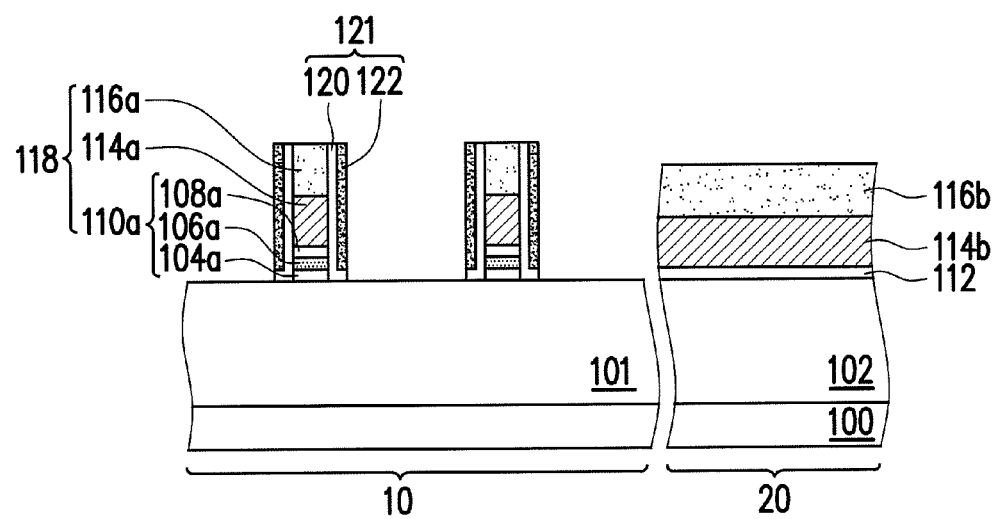

Referring to FIG. 1B, the mask layer 116, the conductive layer 114 and the composite dielectric layer 110 are patterned, so as to form at least two stacked structures 118 in the first area 10 and form a conductive layer 114b and a mask layer 116b in the second area 20. In an embodiment, each stacked structure 118 includes, from bottom to top, a composite dielectric layer 110a, a conductive layer 114a and a mask layer 116a, and the composite dielectric layer 110a includes a silicon oxide layer 104a, a silicon nitride layer 106a and a silicon oxide layer 108a. The method of forming the stacked structures 118, the conductive layer 114b and the mask layer 116b includes forming a photoresist layer (not shown) that covers the mask layer 116 in the entire second area 20 and in a portion of the first area 10. Thereafter, an etching process is performed by using the photoresist layer as a mask.

Afterwards, a spacer 121 is formed on the sidewall of each of the stacked structures 118. In an embodiment, the spacer 121 includes, from the sidewall of corresponding stacked structure 118, an insulating layer 120 and a mask layer 122. In an embodiment, the insulating layers 120 have an etching rate different from that of the mask layers 122 have different etching rates. For example, the etching selectivity of the mask layers 122 to the insulating layers 120 is greater than about 10. In an embodiment, the insulating layers 120 include silicon oxide, and the mask layers 122 include a carbon-containing material, a nitrogen-containing material or a combination thereof. Specifically, the mask layers 122 include SiN, SiCN, SiON, SiOCH, SiC, SiOC, SiOCN or a combination thereof. In an embodiment, each insulating layer 120 is an L-shaped spacer having a horizontal portion and a vertical portion, and each mask layer 122 is an I-shaped spacer seated on the insulating layer 120, as shown in FIG. 1B. However, the present invention is not limited thereto. In another embodiment, each of the insulating layers 120 and the mask layers 122 can be an I-shaped spacer. The method of forming the spacers 121 includes performing at least one a deposition process, and followed by at least one anisotropic etching process.

Figure 1C:
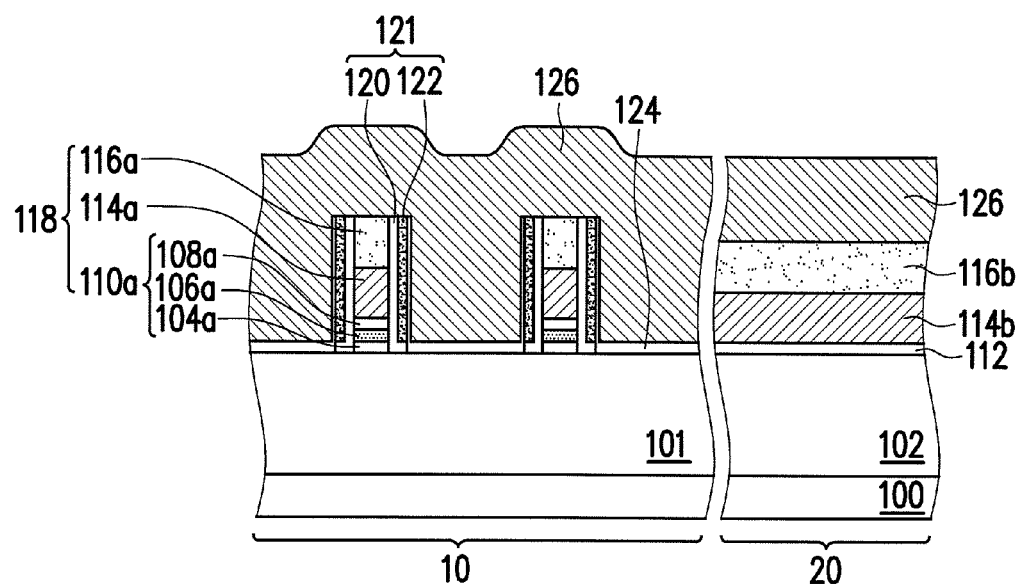

Referring to FIG. 1C, an insulating layer 124 is formed on the substrate beside each stacked structure 118 and on each spacer in the first area 10. In an embodiment, the insulating layer 124 includes silicon oxide, and the forming method thereof includes performing a thermal oxidation process such as a rapid thermal oxidation (RTO) process. In an embodiment, during the thermal oxidation process, the insulating layer 124 is formed thinner on the mask layer 122 (e.g., silicon nitride mask layer) and formed thicker on the substrate 100 (e.g., silicon substrate).

Thereafter, a conductive layer 126 is formed on the substrate 100 in the first and second areas 10 and 20. The conductive layer 126 includes polysilicon, amorphous silicon or a combination thereof, and the forming method thereof includes performing a suitable deposition process such as CVD.

Figure 1D:
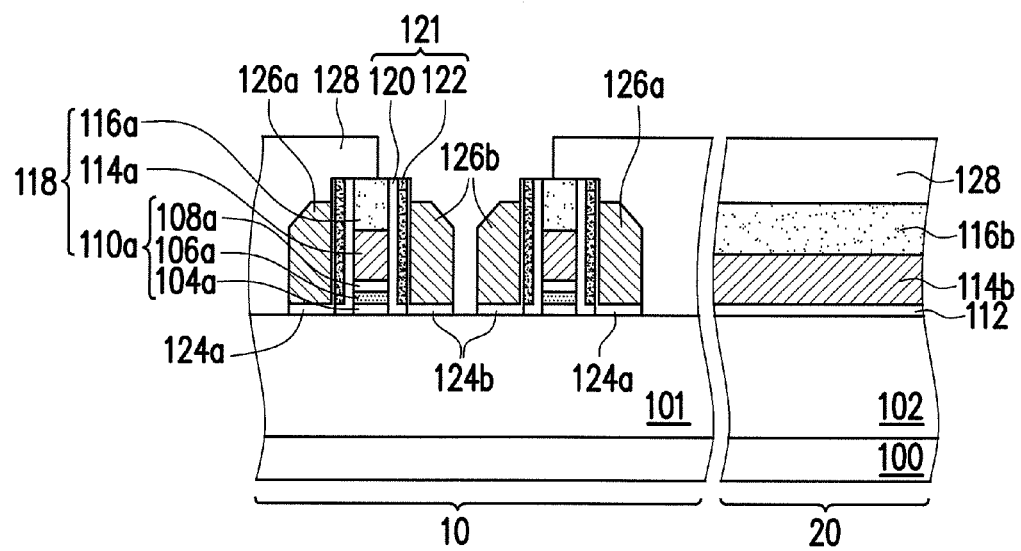

Referring to FIG. 1D, an anisotropic etching process is performed to the conductive layer 126, so as to form conductive layers 126a and 126b, each of which is in a spacer shape, on the sidewalls of the conductive layers 114a. In an embodiment, the anisotropic etching process can further remove a portion of the insulating layer 124, and thus, insulating layers 124a and 124b are formed. Specifically, the conductive layers 126a and the adjacent insulating layers 124a are formed at the outer sides of the adjacent stacked structures 118, and the conductive layers 126b and the adjacent insulating layers 124b are formed at the opposite inner sides of the adjacent stacked structures 118. More specifically, the insulating layers 124a and 124b are L-shaped insulating layers, wherein the insulating layers 124a are located between the mask layers 122 and the conductive layers 126a and between the conductive layers 126a and substrate 100, and the insulating layers 124b are located between the mask layers 122 and the conductive layers 126b and between the conductive layers 126b and the substrate 100.

Afterwards, a mask layer 128 is formed on the substrate 100 in the first and second areas 10 and 20. In an embodiment, the mask layer 128 covers the conductive layer 126a at the outer sides of the adjacent stacked structures 118, and exposes the conductive layers 126b at the opposite inner sides of the adjacent stacked structures 118, as shown in FIG. 1D. Besides, the mask layer 128 can further cover the entire second area 20. In an embodiment, the mask layer 128 can include a photoresist material. In another embodiment, the mask layer 128 can include a dielectric material. The method of forming the mask layer 128 includes performing a spin-coating process or a CVD process.

Figure 1E:
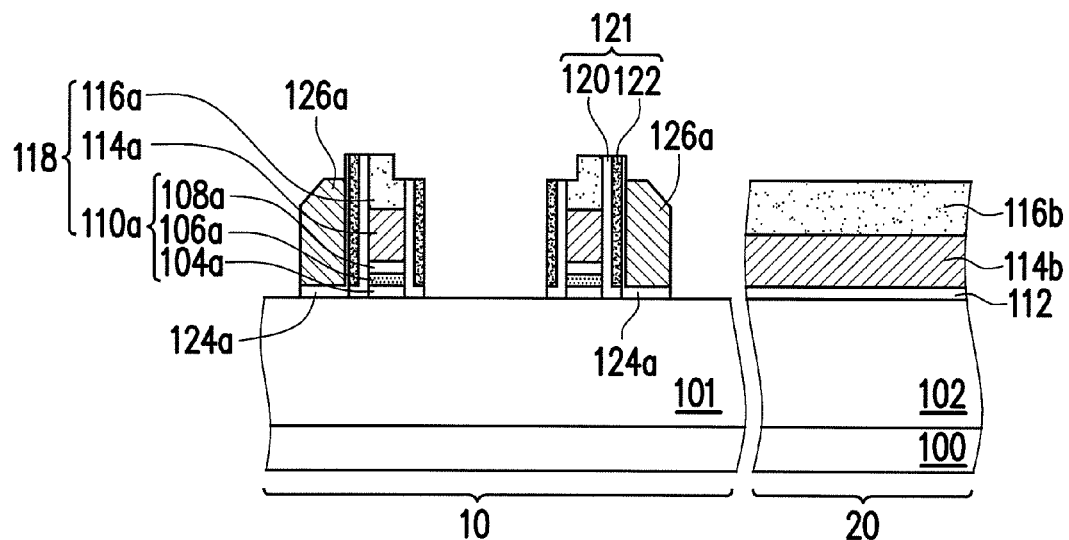

Referring to FIG. 1E, the conductive layers 126a or the conductive layers 126b are removed. In an embodiment, the conductive layers 126b at the opposite inner sides of the adjacent stacked structures 118 are removed by using the mask layer 128 as a mask, while the conductive layers 126a at the outer sides of the adjacent stacked structures 118 remain, as shown in FIG. 1E. The removing step includes performing an etching process. In an embodiment, the removing step can further remove portions of the mask layers 116a, portions of the spacers 121 and the insulating layers 124b adjacent to the conductive layers 126b. The mask layer 128 is then removed.

Figure 1F:
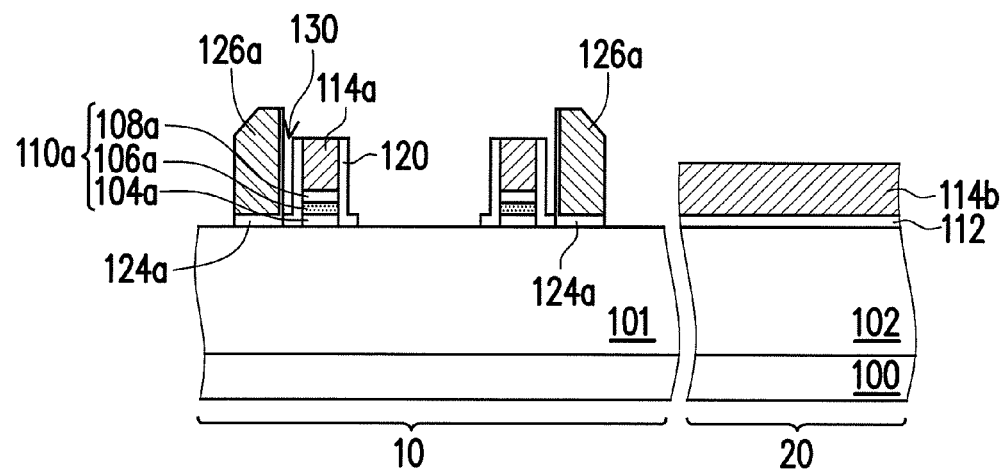

Referring to FIG. 1F, a portion of each spacer 121 is removed, so as to form a gap 130 between the corresponding stacked structure 118 and the corresponding conductive layer 126a. The removing step includes performing an etching process. In an embodiment, at least a portion of the mask layer 122 is removed from each spacer 121. Specifically, the mask layer 122 is completely removed from each spacer 121, as shown in FIG. 1F. In an embodiment, the removing step can further remove the mask layers 116a and 116b and portions of the insulating layers 120 of the spacers 121.

Figure 1G:
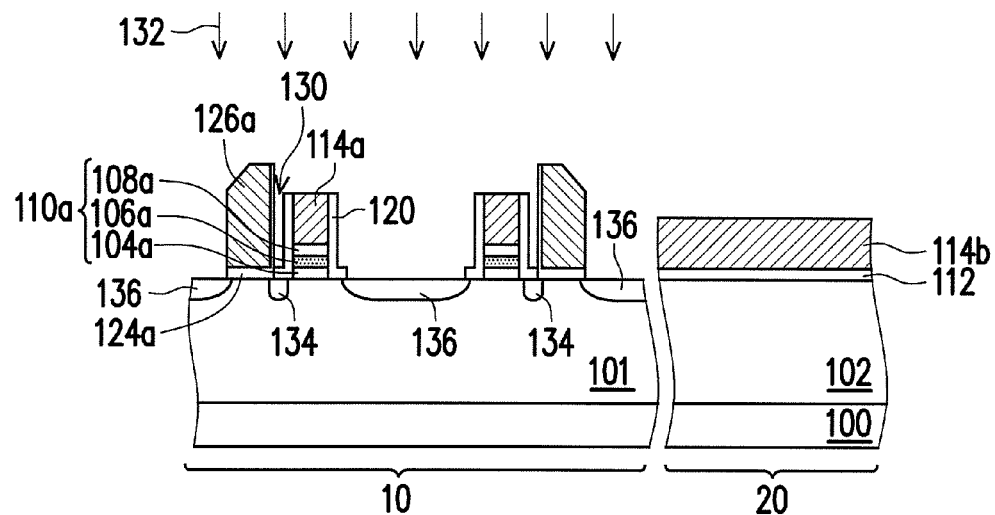

Referring to FIG. 1G, an ion implantation process 132 is optionally performed, so as to form a doped region 134 in the substrate 100 below each gap 130. In an embodiment, the ion implantation process 132 can simultaneously form doped regions 136 in substrate 100 between the adjacent conductive layers 114a and outside of the conductive layers 126a. In an embodiment, the ion implantation process 132 is a self-aligned implantation process by using the conductive layers 114a and 126a as implant masks. In an embodiment, the conductivity type of the doped regions 134 and 136 is different from that of the first well 101 while the same as that of the conductive layers 114a and 126a. By such manner, the operation speed of the memory device can be further increased.

Figure 1H:
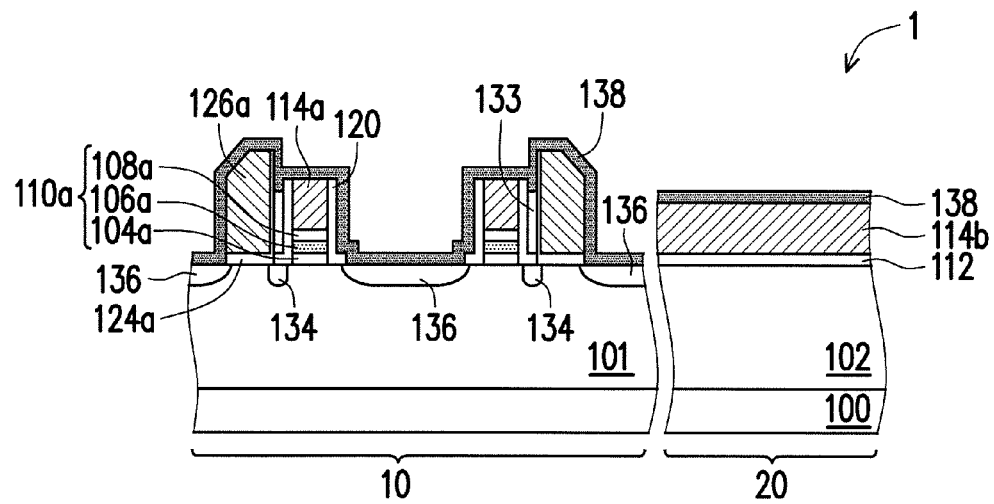

Referring to FIG. 1H, an insulating layer 138 is formed to seal the top of the gap 130 and therefore an enclose space or an air gap 133 is provided. In an embodiment, the insulating layer 138 includes silicon oxide, and the forming method thereof includes performing a suitable deposition process such as CVD. In an embodiment, the air gap 133 is filled with a gas such as a clean air or an inert gas. In another embodiment, the air gap 133 is under a vacuum condition. In an embodiment, the air gap 133 has a width ranging from about 10 angstroms to about 20 angstroms.

In an embodiment, the insulating layer 138 seals the top of the gap 130 and simultaneously covers the tops and outer sidewalls of the conductive layers 114a and 126a. That is, the insulating layer 138 not only serves as a cap layer for sealing the air gap 133, but also serves as a protection layer for the memory device in the first area 10. Besides, the insulating layer 138 is further formed on the surfaces of the conductive layer 114b and further serves as a mask layer for subsequently defining the MOS transistor device in the second area 20. In other words, the memory of the invention is an embedded memory device that can be effectively integrated into the process for forming a MOS transistor device. The semiconductor device 1 of the present invention is thus completed.

In view of the above, the present invention provides a method of forming a semiconductor device. At least one memory gate structure is formed on a substrate 100. In an embodiment, the memory gate structure includes a composite dielectric layer 110a serving as a charge storage layer and a conductive layer 114a serving as a gate. Afterwards, a spacer 121 is formed on the memory gate structure. In an embodiment, the spacer 121 includes, from the sidewall of the memory gate structure, an insulating layer 120 and a mask layer 122. Thereafter, an insulating layer 124 is formed on the spacer 121 and on the substrate 100. A select gate structure is then formed on the substrate 100 at one side of the memory gate structure. In an embodiment, the select gate structure includes a horizontal portion of the insulating layer 124a serving as a select gate insulating layer and a conductive layer 126a serving as a select gate. A portion of the spacer 121 is then removed, so as to form a gap between the select gate structure and the memory gate structure. In an embodiment, the mask layer 122 is removed from the spacer 121. Thereafter, an insulating layer 138 is formed to seal the gap 130 and therefore form an air gap 133.

It is noted that, in the present invention, the air gap 133 encapsulated completely by the insulating layers 120, 124a and 138 is present between the memory gate structure and the select gate structure. The inter-gate capacitance can be effectively reduced due to the low dielectric constant of air (about 1), and thus, the RC delay can be reduced, and the cell speed can be increased.

The forming method described in FIG. 1A to FIG. 1H is provided for illustration purposes, and is not construed as limiting the present invention. Several modified embodiments are provided in the following.

Figure 2:
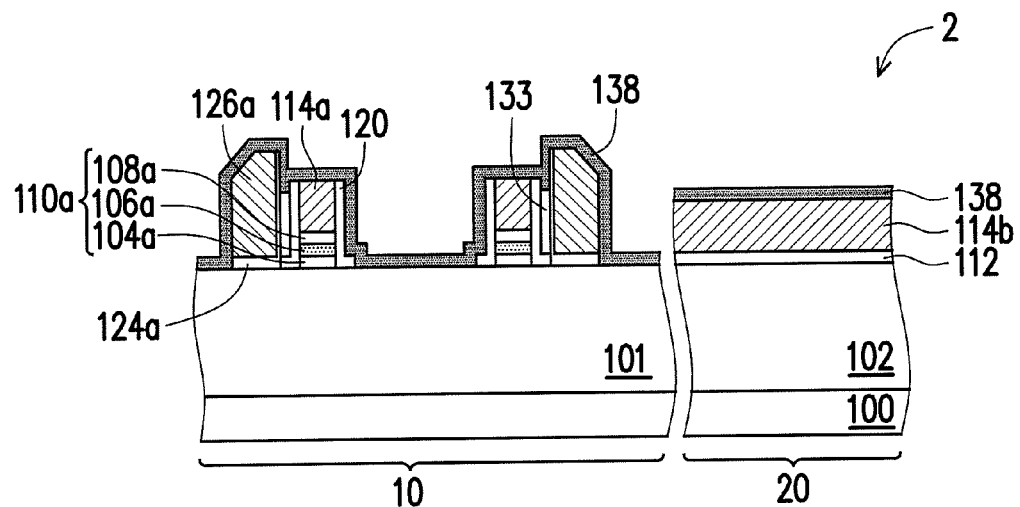
FIG. 2 to FIG. 6 are schematic cross-sectional views of various semiconductor devices according to modified embodiments of the present invention.

In an embodiment, the ion implantation process 132 in FIG. 1G can be omitted from the said forming method, and a semiconductor device 2 of FIG. 2 is thus fabricated.

Figure 3:
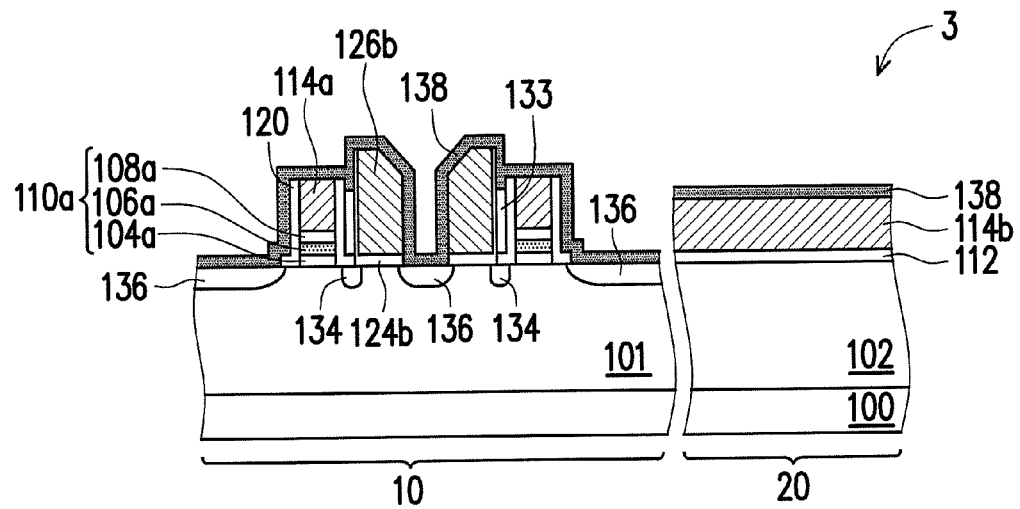

In another embodiment, the steps of FIG. 1D and FIG. 1E can be modified as follows. The mask layer 128 can be designed to cover the conductive layers 126b at the opposite inner sides of the adjacent stacked structures 118, and to expose the conductive layers 126a at the outer sides of the adjacent stacked structures 118. In such manner, the conductive layers 126a at the outer sides of the adjacent stacked structures 118 are removed, while the conductive layers 126b at the opposite inner sides of the adjacent stacked structures 118 remain. A semiconductor device 3 of FIG. 3 is thus fabricated.

Figure 4:
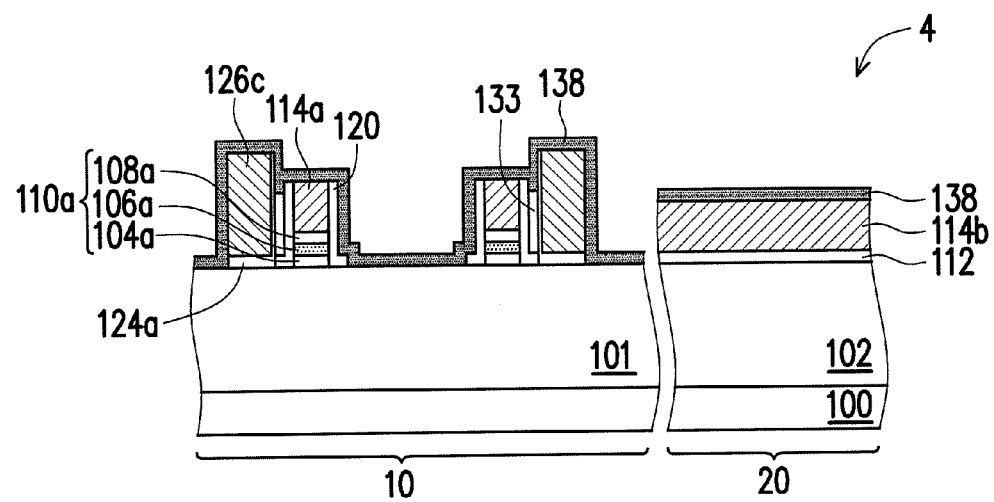

In yet another embodiment, the steps of FIG. 1C to FIG. 1E can be modified as follows. Conductive layers 126c defined by another process are provided with planar surfaces, and such conductive layers 126c are adopted to replace the conductive layers 126a formed in a spacer shape and having an inclined surface. Specifically, after the formation of the conductive layer 126, a chemical mechanical polishing (CMP) process and/or an etching back process is performed to remove a portion of the conductive layer 126, until tops of the mask layers 116a are exposed. Thereafter, photolithography and etching processes are directly performed to define the conductive layers 126c closely adjacent to the stacked structures 118. A semiconductor device 4 of FIG. 4 is thus fabricated.

Figure 5:
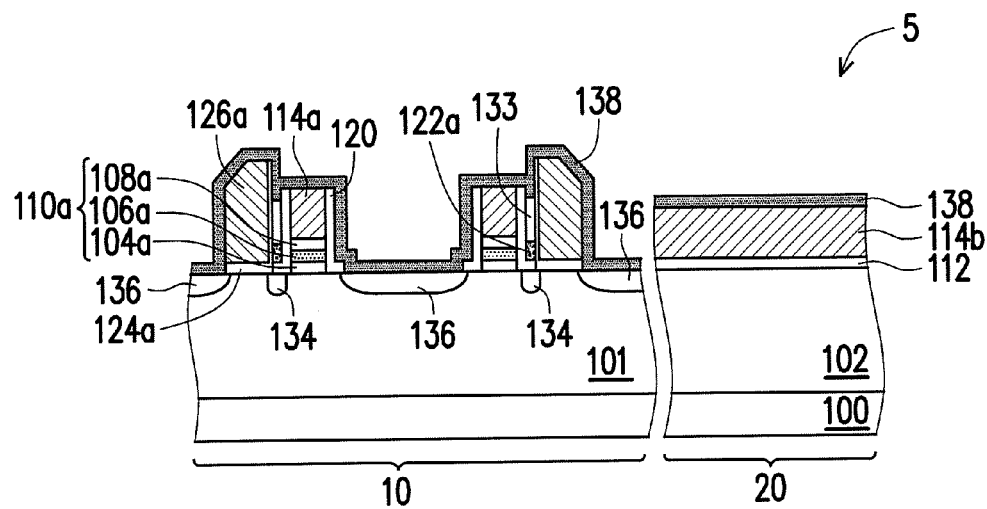

In still another embodiment, the step of FIG. 1F can be modified as follows. For example, only a portion of the mask layer 122 is removed from each spacer 121, and thus, mask layers 122a are left on the bottoms of the gaps 130. A semiconductor device 5 of FIG. 5 is thus fabricated. Specifically, due to the loading effect of the etching process, the mask layers 122 are etched faster in an open area than in the dense area. Therefore, the mask layers 122 at the opposite inner sides of the adjacent conductive layers 114a are etched at a rate greater than that of the mask layers 122 between the conductive layers 114a and the conductive layers 126a. Accordingly, the mask layers 122a remain on the bottoms of the gaps 130 or the air gaps 133.

Figure 6:
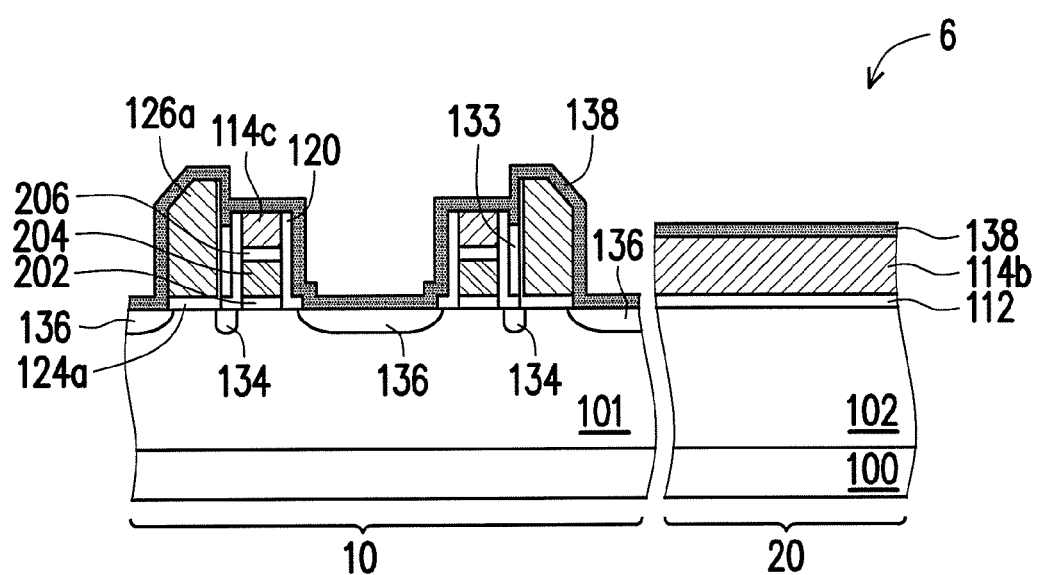

In another embodiment, the memory gate structure of FIG. 1H can be designed to include, from bottom to top, a tunnel insulating layer 202, a floating gate 204, an inter-gate dielectric layer 206 and a control gate 114c, as shown in the semiconductor device 6 of FIG. 6. For example, the step of FIG. 1A can be modified as follows. Provided is a substrate 100 having thereon a tunnel insulating material layer, a floating gate material layer and an inter-gate dielectric material layer in the first area 10, and having thereon an insulating layer 112 in the second area 20. Thereafter, a conductive layer 114 and a mask layer 116 are formed. Steps similar to those described in FIG. 1B to 1H are then performed. A semiconductor device 6 of FIG. 6 is thus fabricated.

Besides, it is appreciated by people having the ordinary skill that the structures of FIG. 1H and FIG. 2 to FIG. 6 can be used in any combination, and the details are not iterated herein.

The semiconductor devices of the present invention are illustrated with reference to FIG. 1H and FIG. 2 to FIG. 6 in the following. The semiconductor device 1/2/3/4/5 of the invention includes a select gate structure and a memory gate structure. In an embodiment, the memory gate structure includes a composite dielectric layer 110 serving as a charge storage layer and a conductive layer 114a serving as a gate, as shown in FIG. 1H and FIG. 2 to FIG. 5. In another embodiment, the memory gate structure includes a tunnel insulating layer 202, a floating gate 204, an inter-gate dielectric layer 206 and a control gate 114c, as shown in FIG. 6.

The memory gate structure and the select gate structure are closely adjacent to each other. In an embodiment, when at least two memory gate structures and at least two select gate structures are provided, the select gate structures are disposed at the outer sides of the adjacent memory gate structures, as shown in FIG. 1H, FIG. 2 and FIG. 4 to FIG. 6. In another embodiment, the select gate structures are disposed at the opposite inner sides of the adjacent memory gate structures, as shown in FIG. 3. In an embodiment, each of the select gate structures is formed in a spacer shape and is disposed on the sidewall of the corresponding memory gate structure, so each of the select gate structures has an inclined top surface, as shown in FIG. 1H, FIG. 2 to FIG. 3 and FIG. 5 to FIG. 6. In another embodiment, each of the select gate structures has a substantially planar top surface, as shown in FIG. 4.

It is noted that, an air gap 133 encapsulated by at least one insulating layer is present between the select gate structure and the memory gate structure. In an embodiment, each of the air gaps 133 is completely encapsulated by the insulating layers 120/124a/138 together, as shown in FIG. 1H, FIG. 2 and FIG. 4 to FIG. 6. In another embodiment, each of the air gaps 133 is completely encapsulated by the insulating layers 120/124b/138 together, as shown in FIG. 3. In an embodiment, the insulating layers 120/124a/124b/138 include the same material, such as silicon oxide. In another embodiment, the insulating layers 120/124a/124b/138 include different materials.

In an embodiment, mask layers 122a are disposed between the air gaps 133 and the insulating layers 124a/124b, and the mask layers 122a and the insulating layers 124a/124b are etched at different rates. In an embodiment, the mask layers 122a include a carbon-containing material, a nitrogen-containing material or a combination thereof. The mask layers 122a can protect the materials underlying and/or aside thereof, such as select gate insulating layers (e.g., insulating layers 124a/124b), charge storage layers (e.g., composite dielectric layers 110a) etc., from being damaged during the step of forming the air gaps 133.

In an embodiment, doped regions 134 are disposed in the substrate 100 respectively below the air gaps 133, and have a conductivity type different from that of the first well 101, and thus, the reading speed of the memory cell can be increased.

In summary, in the semiconductor device of the invention, an air gap fully encapsulated by at least one insulating layer is disposed between the adjacent gates. Therefore, the high inter-gate capacitive coupling and leakage current caused by the short distance between gates and small spacer width can be resolved through such disposition, and the performance of the device can be accordingly improved. Besides, in the present invention, a memory device and a MOS transistor device can be easily integrated together with the existing process, so the process cost is significantly reduced and the competiveness is greatly improved.

The present invention has been disclosed above in the preferred embodiments, but is not limited to those. It is known to persons skilled in the art that some modifications and innovations may be made without departing from the spirit and scope of the present invention. Therefore, the scope of the present invention should be defined by the following claims.

What is claimed is:

1. A semiconductor device, comprising:
a memory gate structure; and
a select gate structure, closely adjacent to the memory gate structure, wherein an air gap encapsulated by an insulating layer is disposed between the memory gate structure and the select gate structure,
wherein the select gate structure has a flat top surface and an outer side surface away from the memory gate structure, and a portion of the outer side surface adjacent to the flat top surface is inclined, the memory gate structure has a flat top surface lower than the flat top surface of the select gate structure and a top surface of the air gap is lower than the flat top surface of the select gate structure;

wherein the insulating layer simultaneously covers the flat top surfaces and outer side surface of the select gate structure and the memory gate structure;

wherein the memory gate structure has a L-shaped spacer;

wherein the air gap is sandwiched between the L-shaped spacer and the select gate structure;

wherein the air gap is directly contacting the spacer;

wherein the air gap has a width ranging from 10 angstroms to 20 angstroms; and wherein the air gap is under a vacuum condition.

2. The semiconductor device of claim 1, wherein the insulating layer comprises silicon oxide.

3. The semiconductor device of claim 1, further comprising a doped region disposed in a substrate below the air gap.

4. The semiconductor device of claim 1, wherein the memory gate structure comprises a charge storage layer and a gate sequentially disposed on a substrate.

* * * * *